(12) United States Patent
Wan et al.

(10) Patent No.: US 6,777,788 B1
(45) Date of Patent: Aug. 17, 2004

(54) METHOD AND STRUCTURE FOR APPLYING THICK SOLDER LAYER ONTO DIE ATTACH PAD

(75) Inventors: Sharon Ko Mei Wan, Melaka (MY); Jaime A. Bayan, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/241,363

(22) Filed: Sep. 10, 2002

(51) Int. Cl.$^7$ ............................................. H01L 23/495
(52) U.S. Cl. ...................... 257/670; 672/676; 174/52.1
(58) Field of Search .............................. 257/666, 670, 257/672, 676; 174/52.1

(56) References Cited

U.S. PATENT DOCUMENTS

| | | | | |
|---|---|---|---|---|
| 5,656,550 A | * | 8/1997 | Tsuji et al. | 438/123 |
| 6,204,553 B1 | * | 3/2001 | Liu et al. | 257/676 |
| 6,562,660 B1 | * | 5/2003 | Sakamoto et al. | 438/124 |
| 2001/0009301 A1 | * | 7/2001 | Azuma | 257/698 |
| 2003/0006055 A1 | * | 1/2003 | Chien-Hung et al. | 174/52.1 |

OTHER PUBLICATIONS

The American Heritage® Dictionary of the English Language, Third Edition copyright © 1992 by Houghton Mifflin Company. Electronic version licensed from INSO Corporation. All rights reserved. American Heritage is a registered trademark of Forbes, Inc.*

U.S. Pat. App. No. 09/658,166 filed Sep. 8, 2000.

U.S. Pat. App. No. 09/528,540 filed Mar. 20, 2000.

U.S. Pat. App. No. 09/528,662 filed Mar. 20, 2000.

* cited by examiner

*Primary Examiner*—Nathan J. Flynn
*Assistant Examiner*—Leonardo Andújar
(74) *Attorney, Agent, or Firm*—Beyer Weaver & Thomas, LLP

(57) ABSTRACT

Embodiments of the invention include an integrated circuit package and methods for its construction. An integrated circuit package of the invention includes a die attach pad and a plurality of lead pads. An integrated circuit die is mounted with the front side of the die attach pad and electrically connected to the plurality of lead pads. Additionally, the backside of the die attach pad includes a pattern of mesas formed thereon. Each of the mesas is configured such that they have a top surface area that is substantially the same size as the surface area of the lead pads. A contact layer of reflowable material is formed on the top surface of the mesas and the lead pads, forming an integrated circuit package with an improved contact layer.

15 Claims, 10 Drawing Sheets

METHOD AND STRUCTURE FOR APPLYING THICK SOLDER LAYER ONTO DIE ATTACH PAD

CROSS REFERENCE TO RELATED APPLICATIONS

This application is related to commonly assigned U.S. patent application Ser. Nos. 09/658,166, 09/528,540, and 09/528,662, each of which is incorporated herein by reference.

TECHNICAL FIELD

The invention described herein relates generally to semiconductor chip manufacturing processes. In particular, the invention relates to improved method and structure for forming solder layers on integrated circuit package electrical contacts.

BACKGROUND OF THE INVENTION

The present invention relates generally to the bulk packaging of integrated circuits. More particularly, the invention relates to the use of leadless packaging processes and designs that utilize a conductive substrate.

A leadless leadframe package (LLP) is a relatively new integrated circuit package design that contemplates the use of a metal (typically copper) leadframe type substrate structure in the formation of a chip scale package (CSP). As illustrated in FIGS. 1(a)–1(c), in typical leadless leadframe packages, a copper leadframe strip or panel 101 is patterned (typically by stamping or etching) to define a plurality of arrays 103 of chip substrate features 105. Each chip substrate feature 105 includes a die attach pad 107 and a plurality of contacts 109 (also known as lead pads or leads) disposed about their associated die attach pad 107. Very fine tie bars 111 can be used to support the die attach pads 107 and leads 109.

During assembly, integrated circuit dies are attached to the respective die attach pads and conventional wire bonding is used to electrically couple bond pads on each die to their associated leads 109 on the leadframe strip 101. After the wire bonding, a plastic cap is molded over the top surface of each array 103 of wire bonded integrated circuit dies.

In order to enhance electrical conduction properties and facilitate attachment of singulated integrated circuit dies to a substrate (e.g., a printed circuit board (PCB)), a back side surface (not depicted in these views) of the leads 109 and the die attach pads 107 are electro-plated with a solder material. The integrated circuit dies are then singulated and tested using conventional sawing and testing techniques.

FIG. 2 illustrates a typical resulting leadless leadframe package after singulation. The die attach pad 107 supports an integrated circuit die 120 which is electrically connected to its associated leads 109 by bonding wires 122. A plastic cap 125 encapsulates the die 120 and bonding wires 122 and fills the gaps between the die attach pad 107 and the contacts 109 thereby serving to hold the contacts in place. A layer of solder material 126 about 8–11 $\mu$m (micron) thick is electro-plated onto the backside surface of the leads 109 and the die attach pads 107.

It should be appreciated that during singulation, the tie bars 111 are cut and therefore the only material holding the contacts 109 in place is the molding material. The resulting packaged chip can then be surface mounted on a printed circuit board (PCB) or other substrate using conventional techniques.

During die attachment to PCBs, a certain fraction of such attachment processes fails to adequately attach the dies to the PCB. Such dies must be removed and "reworked" to facilitate reattachment. Conventional rework processes utilize a much thicker layer of solder material in order to effectively attach the reworked die to a PCB. Layers of solder material used to accomplish the rework process range from 30–90 $\mu$m thick. In conventional processes, the application of this new, thicker solder layer has proven troublesome. The ability to uniformly and repeatedly apply solder materials having appropriate thicknesses to reworked integrated circuit dies has proved an elusive goal. Therefore, continuing efforts are being made to further improve the package structure and processing techniques so that thicker solder layers can be formed, production costs can be reduced, production efficiency can be increased, and/or production yields can be improved.

BRIEF SUMMARY OF THE INVENTION

To address the foregoing issues, as well as others, and according to the purpose of the present invention, an improved method of forming solder layers on a integrated circuit package is disclosed.

One embodiment of the invention comprises a substrate sheet used for forming integrated circuit packages. The substrate sheet is formed of a conducting material having a first surface and a second surface. The substrate sheet is patterned to define a plurality of device features, including a die attach pad and a plurality of associated lead pads. The first surface of the die attach pad is configured to receive a semiconductor integrated circuit die. The second surface of the die attach pad has formed thereon a pattern of mesas configured such that each mesa has a surface area of approximately the same size as the lead pad surface area.

Another embodiment discloses an integrated circuit package having an integrated circuit die attached to the top surface of a die attach pad and electrically interconnected with a plurality of associated lead pads. The combination is encapsulated by a cap such that a bottom surface of the die attach pad and a bottom surface of the lead pads are exposed. The exposed bottom surface of the die attach pad includes a plurality of mesas arranged on the bottom surface of the die attach pad. Each of the mesas is configured having a surface area of approximately the same size as a surface area of a lead pad. A contact layer of reflowable material is formed on the exposed tops of the mesas and on the exposed bottom surfaces of the plurality of lead pads.

Another embodiment discloses a method of packaging integrated circuits. The method includes providing a substrate sheet formed of a conducting material having a first surface and a second surface. The substrate sheet is subjected to a first patterning to define a multiplicity of device areas, each device area including a die attach pad and a plurality of associated lead pads. A second patterning of the second surface of the die attach pads is conducted to generate a pattern of grooves such that the grooves define a multiplicity of mesas on the second surface of the die attach pad. Each of the mesas having a surface area of approximately the same size as the surface area of one of the lead pads. In another embodiment, the foregoing method includes the further steps of attaching a semiconductor die to the first surface of each die attach pad and electrically connecting the die to its associated lead pads. A capping layer is then molded over the device areas to encapsulate the semiconductor dies and to fill in at least some of the grooves. A contact layer of reflowable material is formed on the tops of the mesas and on the exposed surfaces of the lead pads. The substrate sheet is subsequently singulated into individual integrated circuit packages.

Numerous specific implementations of the above-described embodiments are also described. These and other aspects of the invention are described in the following "Detailed Description."

BRIEF DESCRIPTION OF THE DRAWINGS

The present invention is illustrated by way of example, and not by way of limitation. The following detailed description will be more readily understood in conjunction with the accompanying drawings, in which.

It is to be understood that in the drawings like reference numerals designate like structural elements. Also, it is specifically pointed out that the depictions in the drawings are not necessarily to scale.

DETAILED DESCRIPTION OF THE INVENTION

An improved method of forming leadless packages is described below. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 3A:
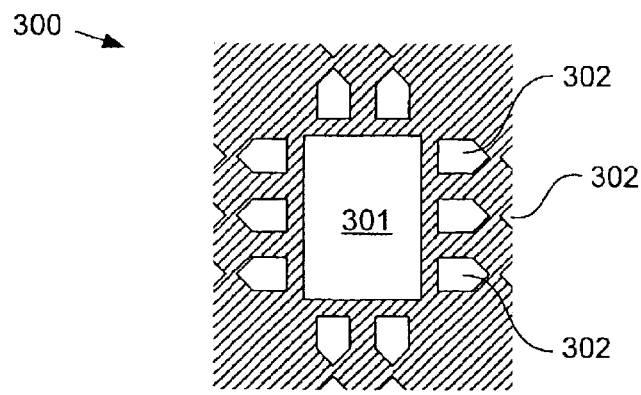
FIG. 3(a) is a plan view of a conventional single chip substrate feature.

As described in the background section, in conventional leadless leadframe packaging, the die attach pads and contacts are preformed in the leadframe strip or panel. FIG. 3(a) depicts a typical example of a chip substrate feature 300 (e.g., as in 105 of FIG. 1(b)) designed to accommodate a single integrated circuit device. In the depicted embodiment, a large die attach pad 301 is surrounded by a plurality of adjacent lead pads 302. Typically, the die attach pad 301 and contact leads 302 are formed of copper.

Figure 3B:
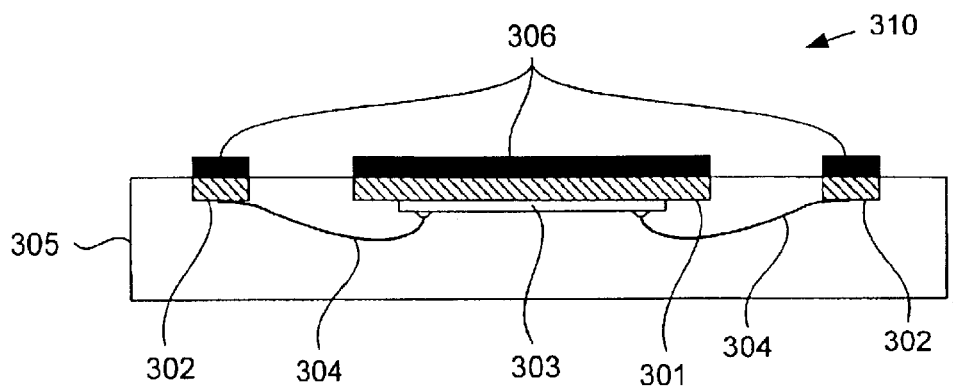
FIGS. 3(b) and 3(c) are cross section views of a integrated circuit package illustrating aspects of a solder "bump" problem known in the art.

FIG. 3(b) depicts a cross section view of an integrated circuit package 310. Using a number of different processes, the die attach pad 301 is attached to an integrated circuit device 303 and electrically connected 304 to the contact leads 302 and encapsulated in a cap 305 of molding material.

When such an integrated circuit package 310 is to be subject to a rework process, a supplementary solder layer 306 is formed on the "backside" of the die attach pad 301 and the contact leads 302. Commonly, the supplementary solder layer 306 is formed to a thickness of about 30–90 $\mu$m thick. Typically, such supplementary solder layers 306 are applied using a "screening" process. Simply put, screening is a process where a solder paste is applied to the surface of a substrate through openings in a screen mask. In the depicted embodiment, the openings in the screen mask are patterned to align with the die attach pad 301 and the lead pads 302. By applying the solder paste through openings in the screen, a supplementary solder layer 306 is applied to the die attach pad 301 and the lead pads 302 of the integrated circuit package 310. The supplementary solder layer 306 is reflowed prior to attachment to a PCB during the rework process. Unfortunately, the solder pastes commonly used during screening include significant amounts of flux and epoxy in addition to the lead (Pb) and tin (Sn). This creates the soft compound needed during screening, but also creates some problems during reflow of the thick solder layers commonly used in the supplementary solder layer 306.

Figure 3C:
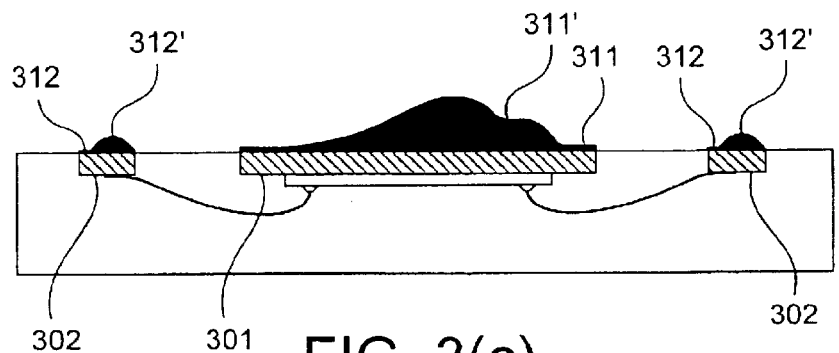

FIG. 3(c) is a cross section view of an integrated circuit package illustrating one problem in the existing approaches. During reflow, pooling can occur in the liquefied solder compounds used on the bottom of the die attach pad 301 and the lead pads 302. This pooling can lead to the formation of bumps in the solder layers. The amount of solder and the effects of surface tension cause differing effects during reflow processes. In smaller surface areas, small bumps are formed in the supplementary solder layers. However, in larger surface areas much taller bumps are frequently formed. This variation in bump height is figuratively illustrated in the schematic depiction of FIG. 3(c). In a typical integrated circuit package, a die attach pad 301 can be, for example, 5 mm×5 mm. In comparison, typical lead pad 302 embodiments are about 0.25 mm×0.50 mm. Thus, lead pads 302 commonly have surface areas hundreds of times smaller than those of a die attach pad 301. One consequence of this size differential is that the supplementary solder layer 312 over the lead pads 302 contains significantly less solder material than the supplementary solder layer 311 over the die attach pad 301. As a result, during reflow large bumps 311' are formed in the supplementary solder layer 311 over the die attach pad 301. This is in contrast to the significantly smaller bumps 312' formed in the supplementary solder layer 312 over the lead pads 302. As a result, the large bumps 311' of the die attach pad are much taller than the smaller bumps 312' of the lead pads. This discrepancy in bump height hinders the reapplication of the reworked (and reflowed) integrated circuit packages onto PCBs. Because the contacts (die attach pads and lead pads) have differing heights, the package cannot be electrically connected to the PCB without some contacts failing to make contact. Thus, the package cannot be properly mounted with the PCB. Thus, a way of generating uniform bump height in the solder layers of a reworked integrated circuit package is needed. Therefore, what is needed is a method and structure for applying a relatively thick layer of solder onto die attach pads and lead pads so that, after reflow, the solder layers have substantially the same bump height for both the die attach pads and lead pads.

In order to solve these and other problems, embodiments of the present invention use a pattern of mesas formed on a back side surface of a die attach pad in order to create a plurality of smaller surfaces that are used for forming solder layers. These smaller surfaces are formed having surface areas of approximately the same size as that of the surface areas of lead pads. Consequently, solder layers formed on the mesas and on the lead pads can achieve more uniform bump sizes during reflow.

Figure 1A:
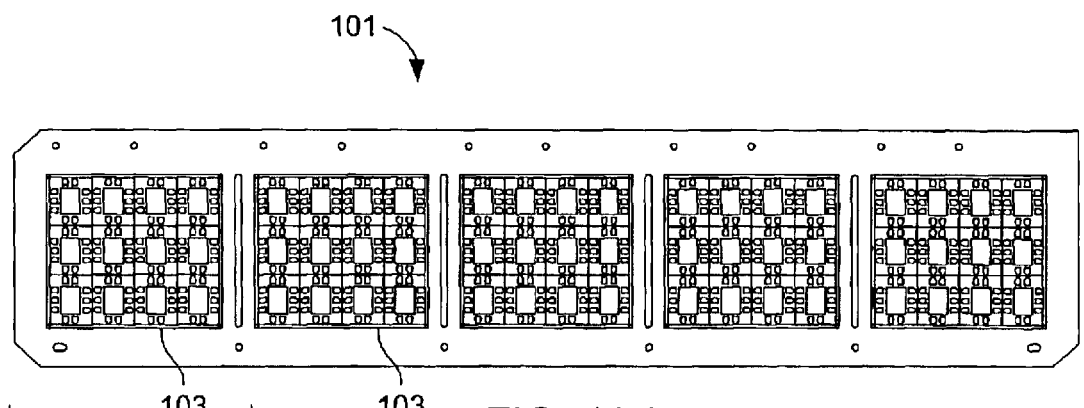
FIGS. 1(a)–1(c) are diagrammatic top views of a conventional lead frame strip suitable for use in forming leadless leadframe packages.
Figure 1B:
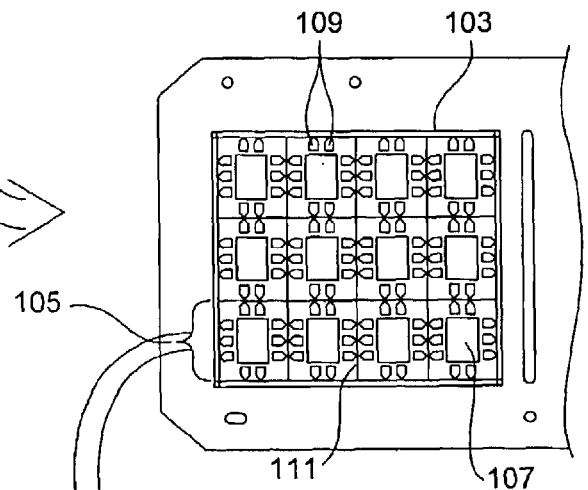

In one embodiment of the present invention, the substrate sheet (e.g., 101 of FIG. 1(a)) is formed of a conducting material and patterned (typically by stamping or etching) to define a plurality of arrays 103 of chip substrate features 105. One typical example of such an array is shown in FIGS. 1(a) and 1(b) which depict a substrate sheet after patterning. The methods of forming such patterned substrate sheets are known in the art. Examples of satisfactory approaches for forming such substrate sheets 101 are disclosed in U.S. patent application Ser. Nos. 09/658,166 and 09/528,540, each of which is incorporated herein by reference. In most common usage, the substrate sheets are formed of conducting materials such as copper or copper-containing materials (e.g., copper/silicon or other copper alloy compounds). However, as is known to those having ordinary skill in the art, many other conducting materials can be used.

Figure 4A:
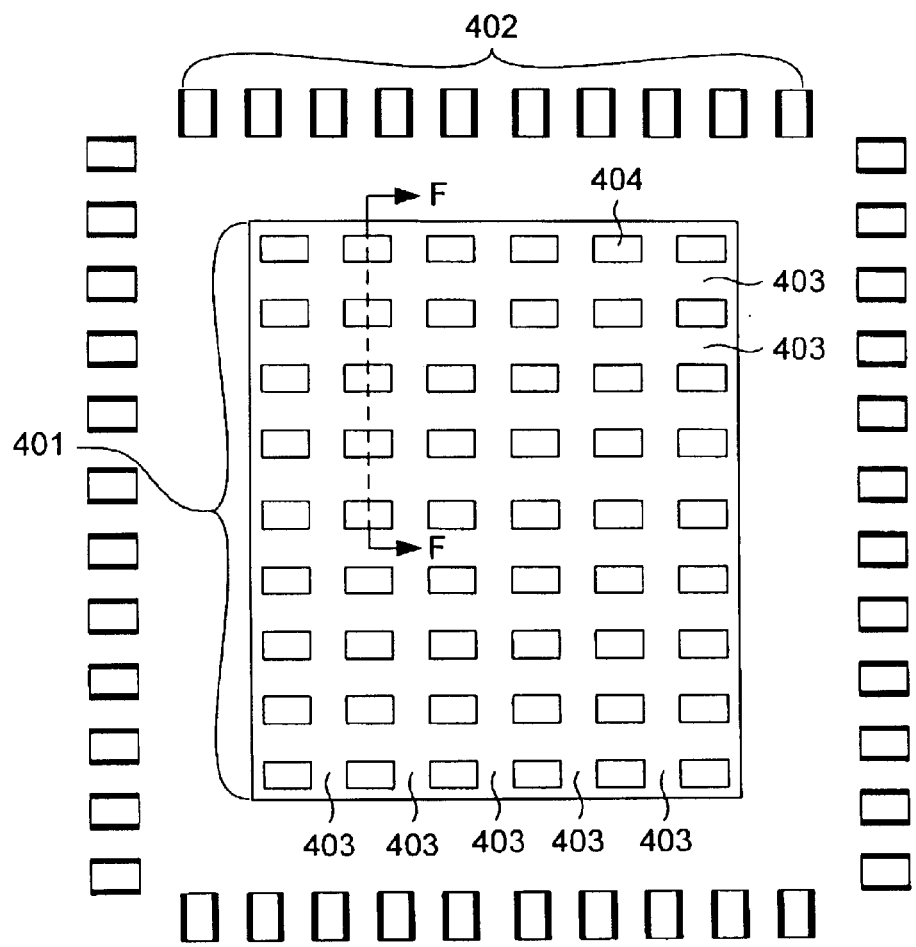
FIGS. 4(a) and 4(b) are diagrammatic plan and cross section views of the back side of a die attach pad after being patterned in accordance with the principles of the present invention.

After patterning the substrate sheet, the backside surface of each die attach pad is patterned to form an array of mesas. One depiction of such an embodiment is illustrated in FIG. 4(a). FIG. 4(a) is a simplified schematic plan view of a portion of the backside of a chip substrate feature. An important aspect of the invention is that the top surfaces of the mesas have a surface area that is approximately equal to the surface area of associated lead pads. As used herein, "approximately" means that the top surface areas of the mesas are within about 50% to about 200% of the surface area of associated lead pads. The following example will illustrate the principle. A die attach pad 401 is depicted with a plurality of associated lead pads 402 arranged around the die attach pad 401. The depicted embodiment has a die attach pad 401 with dimensions of about 4.5 mm×4.5 mm. The surrounding lead pads 402 are about 0.25 mm×0.50 mm in size. Using the foregoing description as an example, the lead pads have a surface area of about 0.125 mm$^2$. A mesa having approximately this surface area can range from about 0.0625 mm$^2$ to about 0.25 mm$^2$. Although these precise dimensions are given, they are examples and are not intended to be limiting. Many other sizes and shapes can be incorporated into the present invention.

Still referring to FIG. 4(a), the die attach pad 401 is etched to form a pattern of grooves 403 that define a plurality of features called mesas 404. In the depicted embodiment, the mesas 404 are shown as a multiplicity of rectangular boxes formed on the backside of the die attach pad 401. The spaces between the mesas are called the grooves 403. Conventional etch methodologies can be used to form the grooves 403 and mesas 404. In the depicted embodiment, the mesas 404 are about 0.25 mm×0.50 mm.

Figure 4B:
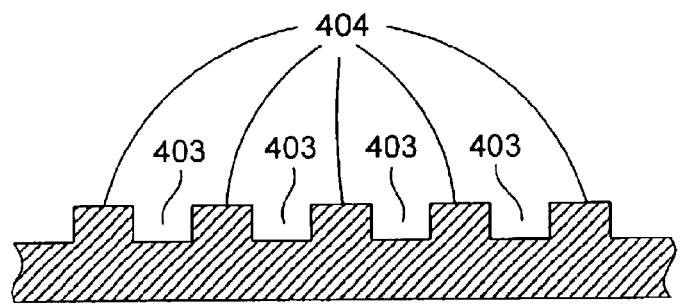

FIG. 4(b) is a cross-section view of the embodiment shown in FIG. 4(a) along axis F—F. In one embodiment, the grooves 403 are formed to a depth of about 100 μm. As is known to persons having ordinary skill in the art, the groove depth can be greatly varied. In addition to the pattern of grooves 403 and mesas 404 depicted in FIGS. 4(a) and 4(b), many other implementations are possible. A further discussion of some of these implementations is described hereinbelow.

FIGS. 5(a)–5(f) depict another approach useful in constructing embodiments in accordance with the principles of the present invention.

Figure 5A:
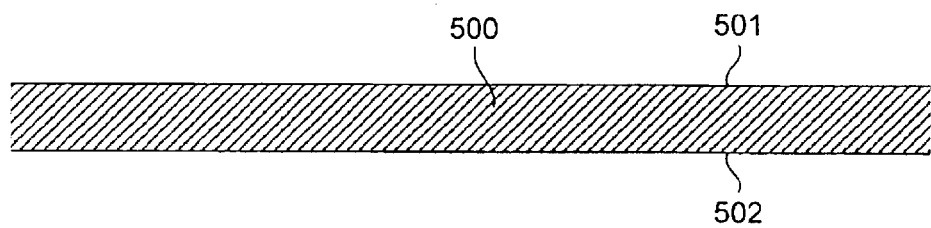
FIGS. 5(a)–5(f) are diagrammatic cross sectional side views illustrating actions involved in packaging an integrated circuit in accordance with one embodiment of the present invention.

In the sequence of FIGS. 5(a)–5(f), a process embodiment is described in detail. Initially, a substrate sheet 500 is provided as illustrated in FIG. 5(a). For common reference, the substrate sheet 500 includes a first surface 501 and an opposing second surface 502. The substrate sheet is formed from a conductive material that is suitable for use as package electrical contacts. By way of example, copper works well, and as such is the material most commonly used in such semiconductor packaging applications. However, other materials including, but not limited to, other copper-containing materials, aluminum, or Alloy 42 may be used instead. Typically, the substrate sheet is on the order of about 6–12 mils thick, with a preferred thickness of about 8 mils. However, the substrate sheet 500 may take any appropriate form factor. Today, much of the packaging handling equipment that is available is designed for handling leadframe strips and therefore, leadframe strips may be used as the substrate sheet. Alternatively, in many respects, metal panels (e.g. copper panels) are more appropriate since they will typically have better rigidity and facilitate better space utilization. The panels may take any form, although substantially square or rectangular panels are expected to be the most common.

Figure 1C:
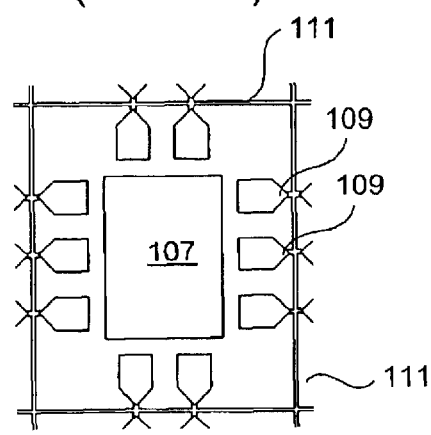
Figure 2:
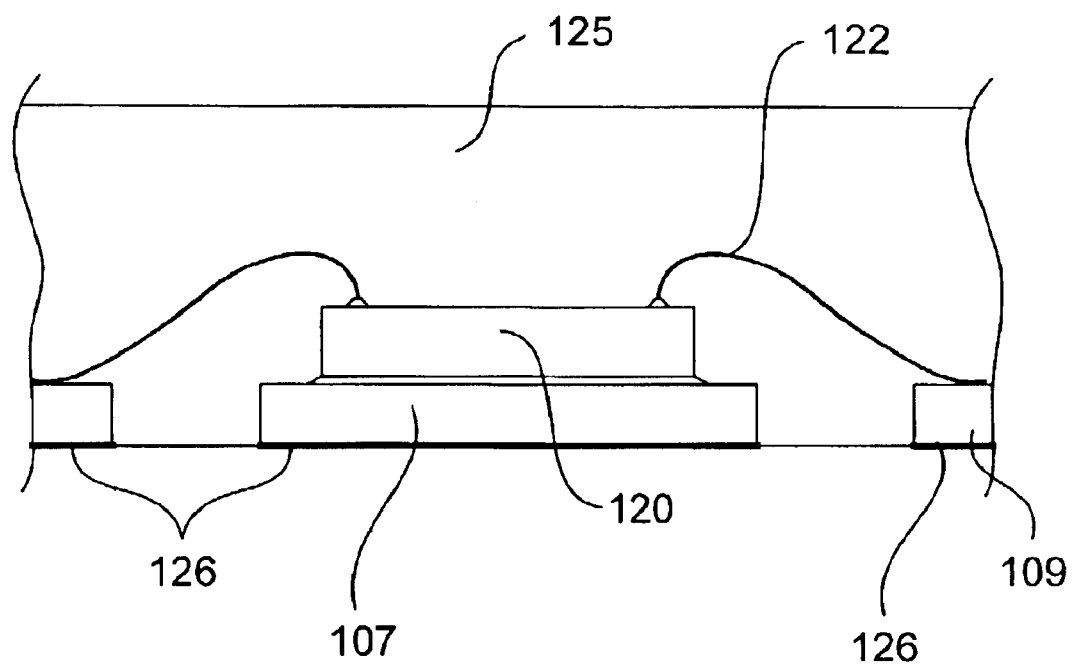
FIG. 2 is a diagrammatic cross sectional side view of a conventional leadless leadframe package.

The panel 500 is patterned to define one or more arrays of device areas on the panel 500. Each device area (illustrated in FIGS. 1(a)–1(c)) has the appropriate surface features formed thereon. Typically, the desired surface features in each device area will include a plurality of lead pads and a die attach pad as best illustrated in FIG. 3(a) and in alternate view FIG. 5(b).

Figure 5B:
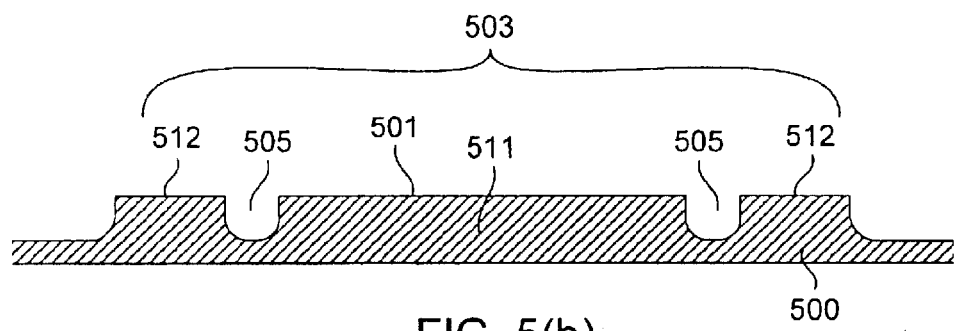

As best seen in FIG. 5(b), troughs 505 are formed in the first surface 501 of the substrate sheet 500 as part of the patterning that defines the desired device areas 503. The troughs 505 preferably extend a majority of the way through the substrate panel 500 but do not extend all of the way through the substrate panel. In most implementations, it is expected that the depth of troughs will be greater than 50% of the thickness of the substrate.

The troughs 505 may be formed by any suitable process. This is sometimes referred to herein as a half etch or partial etch process, since the etch is intended to form troughs in the substrate rather than etch completely through the substrate panel 500. A wide variety of conventional etching techniques can be used to facilitate the etching. In one specific example, a photo-lithographic based etch process may be used. However, it should be apparent to those persons having ordinary skill in the art that the techniques, chemistries, and/or processes used to etch (or grind or otherwise form) the troughs 505 can be widely varied within the scope of the present invention.

In the illustrated embodiment, the patterning includes defining die attach pads 511. In some instances, it may be desirable to effectively thin or even eliminate the die attach pads so that the dies sit lower in the package relative to the top surface of the lead pads 512. This can readily be done by either etching the region to which the dies will be attached, to either the full depth of the troughs (to eliminate the die attach pads) or to a portion of the depth of the troughs (to provide reduced height die attach pads). One advantage of this approach is that it may reduce the inductance of the packaged device. This arrangement is more fully discussed in patent application Ser. No. 09/528,662 (filed Mar. 20, 2000), which is incorporated herein by reference.

Figure 5C:
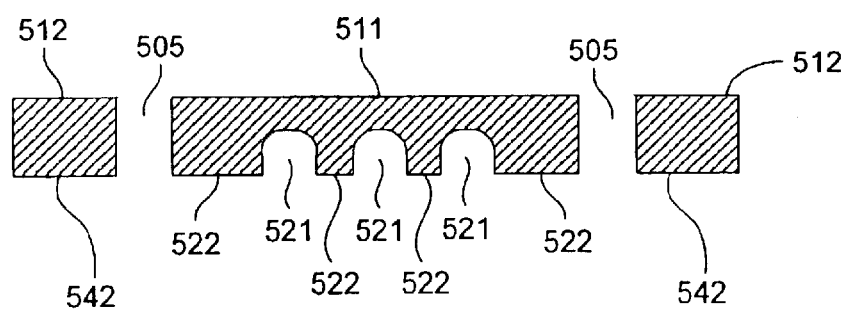

Once the first patterning (e.g., as shown in FIG. 5(b)) is achieved and after any desired plating is accomplished, a second patterning of the substrate is undertaken. The inventor points out that the second patterning can be performed at the same time as the first patterning. FIG. 5(c) depicts a second patterning of the substrate. The second surface 502 is patterned on the back side of each die attach pad 511. A pattern of grooves 521 is formed such that a multiplicity of mesas 522 are formed in the backside of each die attach pad 511. The grooves 521 may be formed by any suitable process. As with the etching of the troughs described hereinabove, the etching of the grooves 521 is intended to form grooves in the substrate rather than etch completely through the substrate panel. A wide variety of conventional etching techniques can be used to facilitate the etching. In one specific example, a photo-lithographic based etch process can be used. However, it should be apparent to those persons having ordinary skill in the art that the techniques, chemistries, and or processes used to etch (or otherwise form) the grooves 521 can be widely varied within the scope of the present invention.

The depth of the grooves 521 may be widely varied and typically depend on a number of factors including, but not limited to, the substrate strength desired during later processing, the depth of troughs formed in the surface, the desired thickness of the resultant packages, and the process controls of the etching process used to form the grooves. In most implementations, the grooves 521 are etched to a depth of about half the thickness of the substrate 500. In one such embodiment, the grooves 521 extend about 4 mils into an 8 mil thick substrate. At the same time the backside material of the troughs 505 is removed. As with the grooves, this is commonly achieved by etch processes. This effectively physically separates the lead pads 512 from one another thereby forming independent contacts 542. It also physically separates the die attach pad 511 from the contacts 542. Thus, the components are held in place by the tie bars which will be removed during singulation of the dies. Thus, by completing the etch-through of the troughs 505, the die attach pads 511 are electrically isolated from the contacts 542. Moreover, the etching of the pattern of grooves 521 enables the formation of mesas 522.

After the substrate panel 500 has been patterned, it may optionally be plated with a material that facilitates better wire bonding. In such implementations, the lead pads 502 can be selectively plated in order to save material. A variety of plating materials may be used. One example is silver plating, since it is well known that gold bonding wires bond better with a silver plating than with an un-plated copper substrate. In other embodiments, alternative materials such as palladium-nickel (PdNi) may be used to facilitate bonding. Of course, the actual plating materials used may be widely varied and a number of suitable materials are commercially available.

Figure 5D:
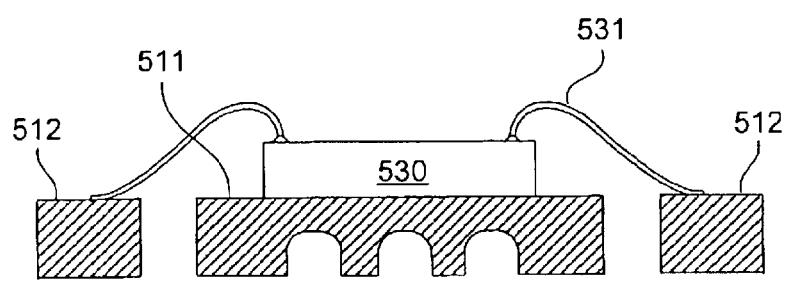

After the first and second patterning, integrated circuit dies can be mounted on the die attach pads. As depicted in FIG. 5(d), semiconductor integrated circuit dies 530 are mounted on the die attach pads 511 using conventional die attachment techniques. Thereafter, the dies 530 are electrically connected to associated ones of the lead pads 512. In the embodiment shown, wire bonding is used to electrically connect the dies 530 to their associated lead pads 512. Thus, bonding wires 531 electrically couple the dies 530 to the lead pads 512. As suggested above, bonding wires 531 are typically formed from gold. As explained above, when gold bonding wires 531 are used in combination with a copper substrate, it is advantageous to silver (or otherwise) plate the lead pads 512 to improve the adhesion of the bonding wires 531 to the lead pads.

Figure 5E:
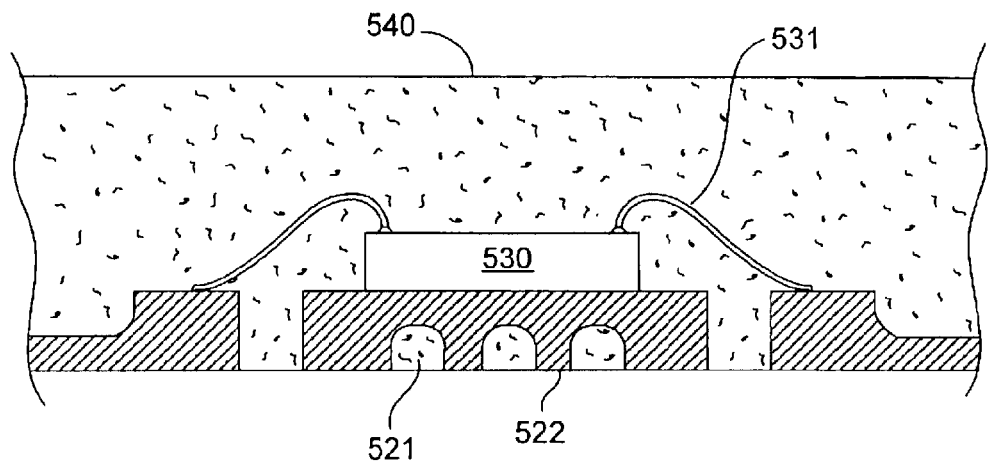

After all of the dies 530 have been wire bonded or otherwise electrically connected to the appropriate lead pads 512, one or more caps 540 are formed over the substrate panel as illustrated in FIG. 5(e). In some embodiments, a separate cap can be formed over each separate array of device areas. However, it should be appreciated that alternatively a single cap or a different number of caps can readily be provided. The caps 540 may be formed using any conventional molding process including transfer molding and injection molding. In the described embodiment, a molded array type transfer molding process is used. It should be pointed out that, as the caps 540 are formed with molding material, the backside grooves 521 are also filled with molding material. This serves to isolate the mesas 522 from each other. A preferred molding material is a thermoset molding compound with bi-phenol or multi-functional base.

Figure 5F:
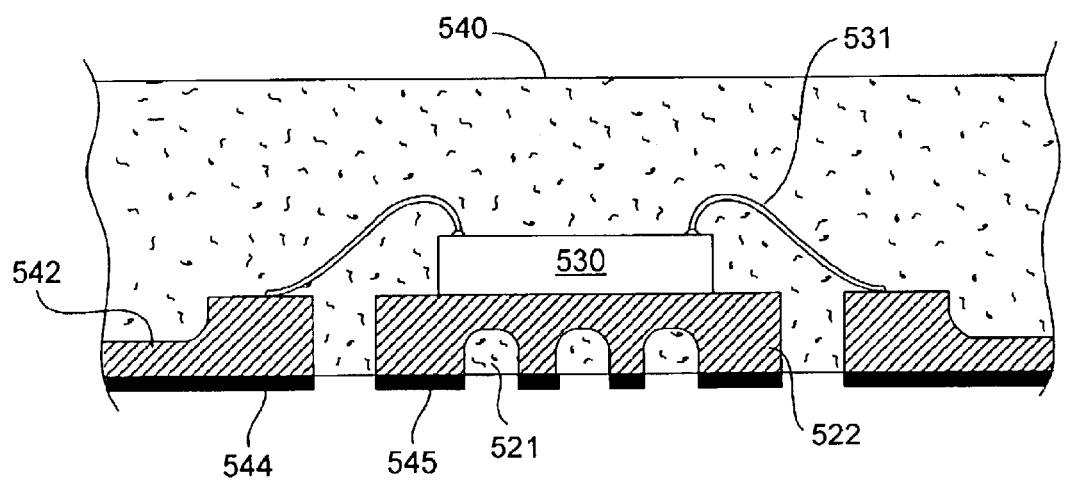

Referring to FIG. 5(f), a contact layer 545 is formed on the bottom surfaces of the independent contacts 542 and the exposed portions of the mesas 522. The contact layer 545 can be formed of a reflowable material by a variety of methodologies known to those having ordinary skill in the art. In one example, the contact layer 545 can be formed by electroplating (also called plating) a layer of reflowable material (e.g., solder) onto the independent contacts 542 and top portions of the mesas 522. This is most effective for solder layers less than about 15 $\mu$m thick. Plating can also be used to form thicker solder layers. However, for thicker layers it is probably more efficacious to employ screening techniques to form the contact layer 545. Such techniques involve placing a screen mask having a pattern of openings therein over the substrate panel. The screen mask is aligned so that the patterned openings in the screen mask correspond to the independent contacts 542 and the exposed portions of the mesas 522. A solder paste is applied to the mask with a portion of the paste passing through the openings in the mask onto the substrate to form the contact layer 545. Although useful for the formation of solder layers of many thicknesses, this method is particularly effective for the application of thicker solder layers in the range of about 25–90 $\mu$m thick. Such a method can be used to construct integrated circuit packages that are well suited for rework applications due to their thicker solder layers.

Once the solder layer has been applied, any additional process steps that are desired may be performed. As will be appreciated by those skilled in the art, these may include, but are not limited to, singulating the packaged integrated circuits.

The foregoing embodiment uses etching to form a pattern of grooves on the backside of a die attach pad (e.g., FIG. 5(c)) thereby defining the mesas. In an alternative approach, additional material can be deposited onto the back side of the die attach pad to generate a pattern of raised features (mesas) having a pattern of grooves between them. Such a structure can be formed, for example, by masking the backside of the substrate to define a multiplicity of openings on the back side of the die attach pad (and in some embodiments on the lead pads). Additional material can then be deposited into the openings to form the mesas (and increase the height of the lead pads).

Figure 6A:
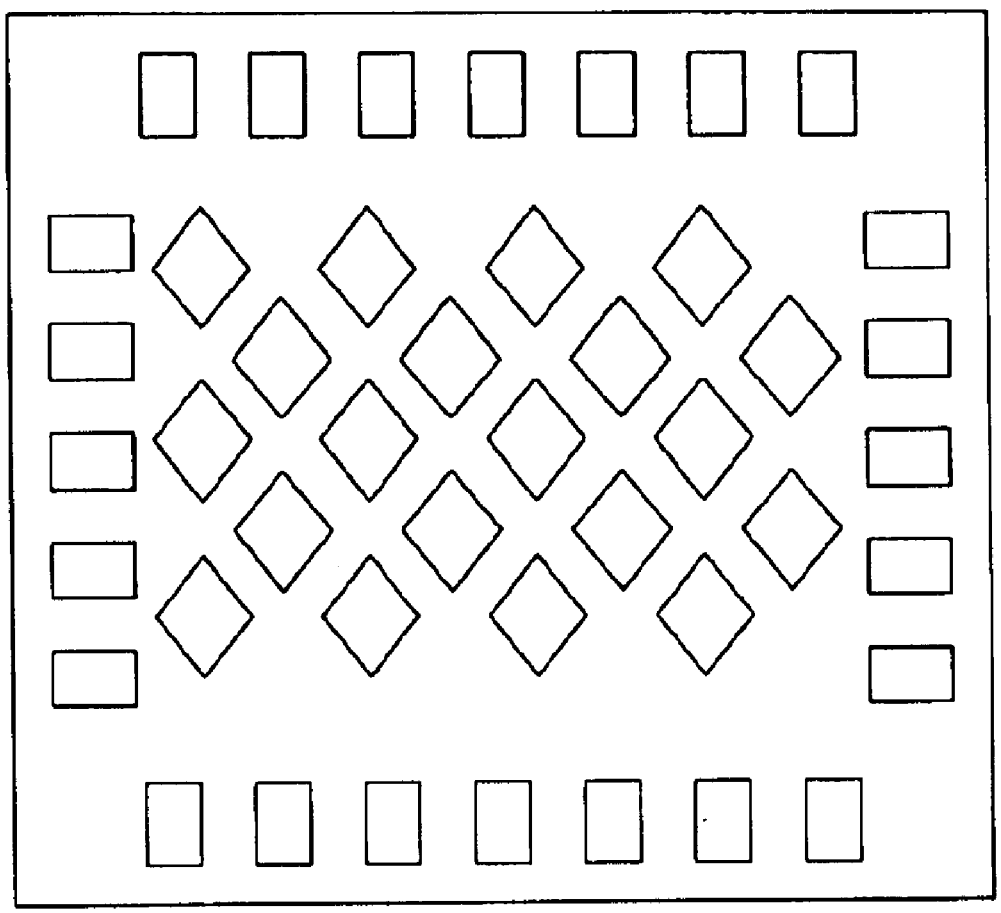
FIGS. 6(a)–6(d) are diagrammatic plan views of various mesa patterns formed on embodiments of a die attach pad in accordance with the principles of the present invention.
Figure 6B:
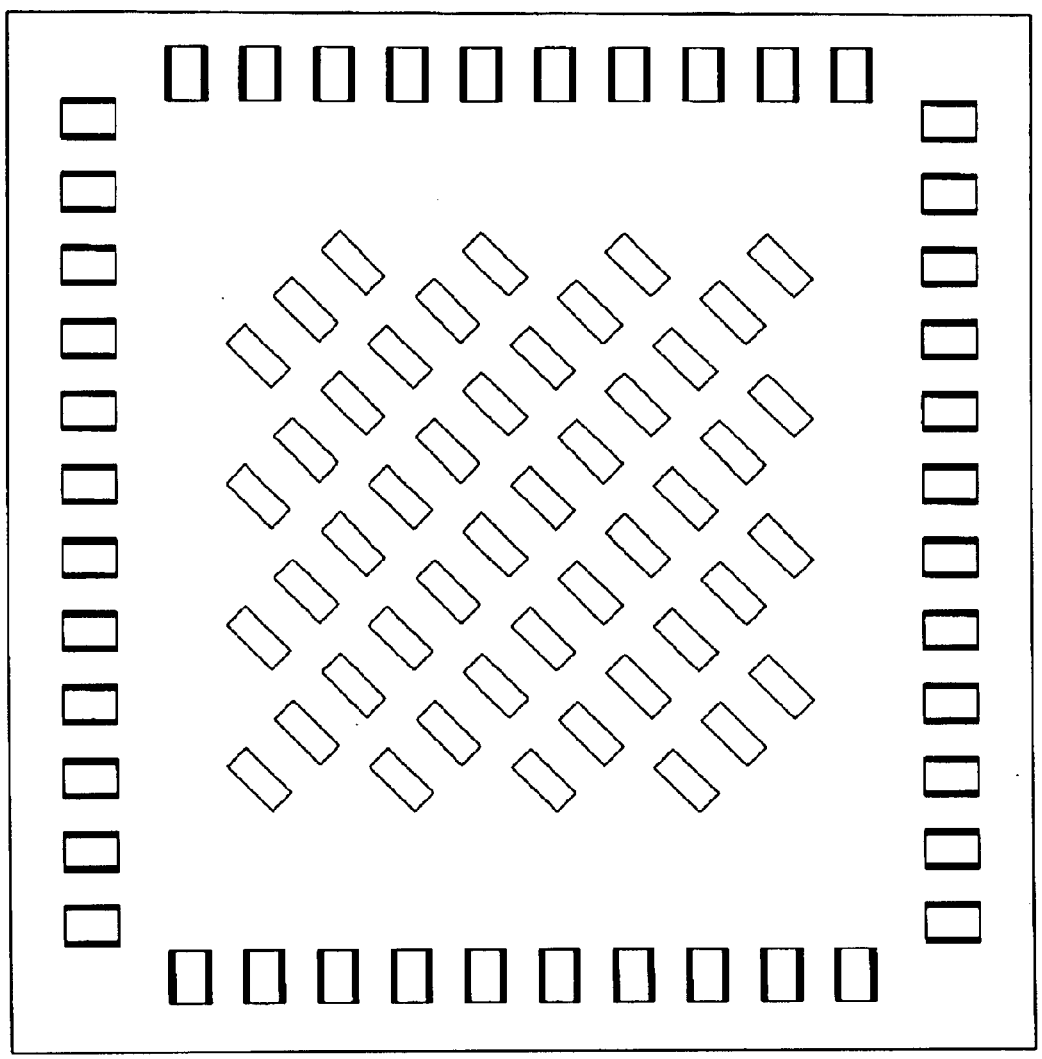
Figure 6C:
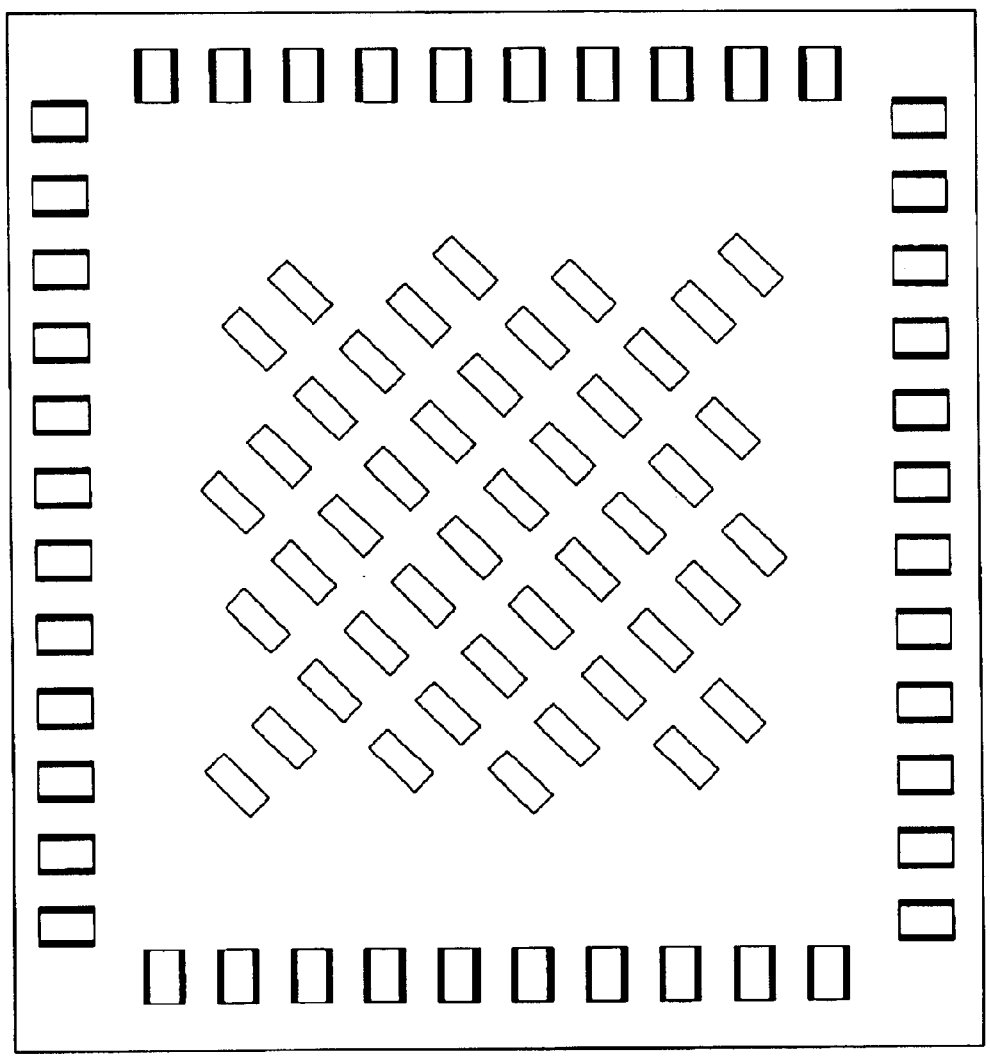
Figure 6D:
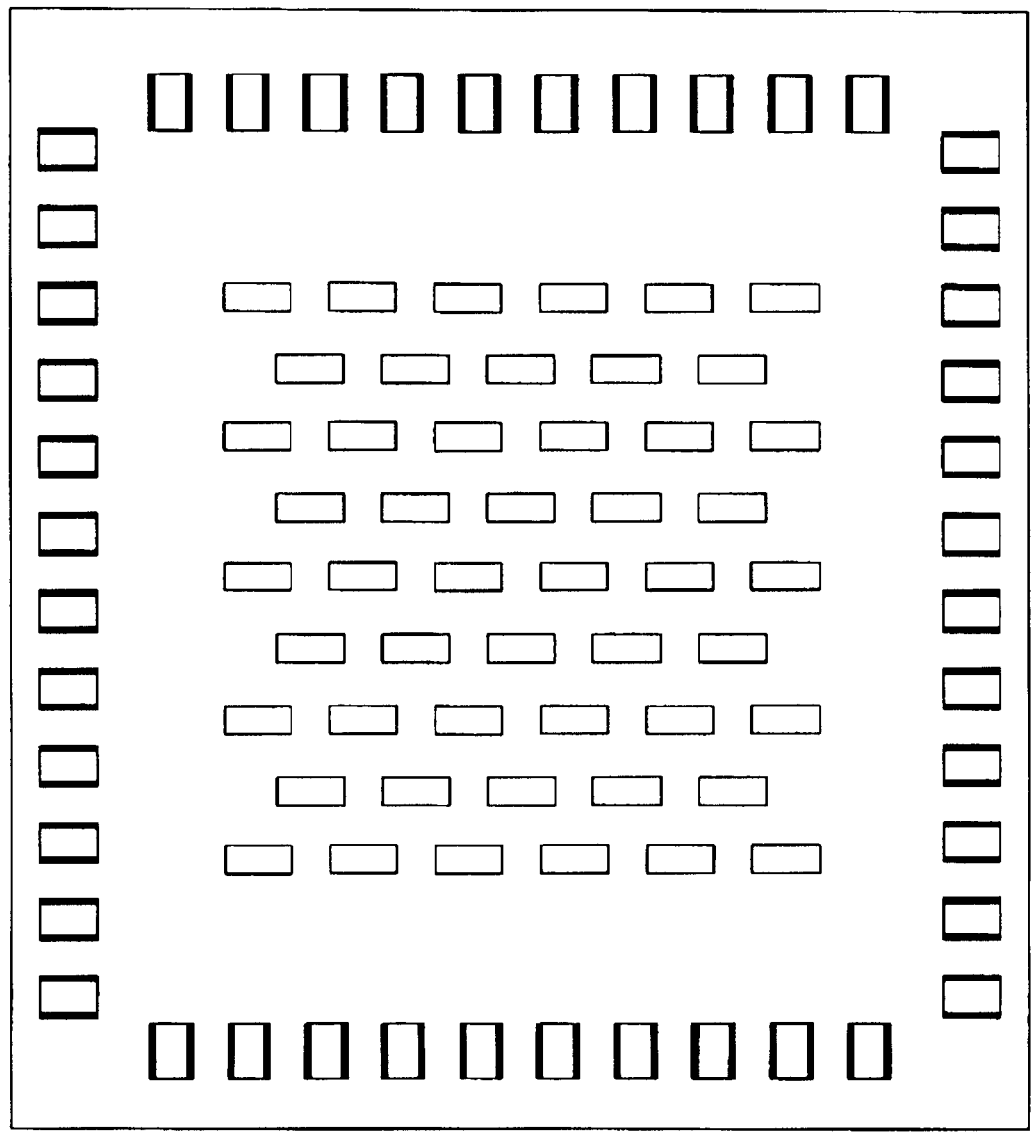

FIGS. 4(a) and 4(b) depict one embodiment for a mesa and groove configuration. FIGS. 6(a)–6(d) are plan views depicting the back side of a die attach pad that has been patterned with other examples of mesa and groove embodiments in accordance with the principles of the present invention. FIG. 6(a) depicts an arrangement of diamond shaped mesas formed on the backside surface of a die attach pad in accordance with the principles of the present invention. FIGS. 6(b)–6(d) depict a variety of arrangements of rectangularly shaped mesas formed on the backside surface of a die attach pad in accordance with the principles of the present invention. These embodiments as well as others are within the intended scope of the invention.

Although the foregoing invention has been described in some detail for purposes of clarity of understanding, it will be apparent that certain changes and modifications may be practiced within the scope of the appended claims. For example, a number of conventional package processing techniques have been described as being used in the formation of the described devices. It should be apparent that in most cases these processing techniques can be widely varied and a wide variety of alternative conventional processes may be used in their place. Accordingly, the present embodiments are to be considered as illustrative and not restrictive, and the invention is not to be limited to the details given herein, but may be modified within the scope and equivalents of the appended claims.

What is claimed is:

1. An integrated circuit package comprising:
   a substrate sheet formed of a conducting material and having a first surface and a second surface:
   the substrate sheet being patterned to define a plurality of device features;
   the device features including a die attach pad and a plurality of associated lead pads;
   the first surface of the die attach pad configured to receive a semiconductor integrated circuit die; and
   the second surface of the die attach pad having formed thereon a pattern of mesas configured such that each mesa has a surface area of approximately the same size as a lead pad surface area.

2. The integrated circuit package of claim 1 wherein the pattern of mesas is formed by etching a pattern of grooves in the second surface of the die attach pad thereby defining the pattern of mesas and
   wherein a pattern of reflow layers, formed of reflow material, are formed on the surface of the mesas and on surfaces of the lead pads so that the reflow layers are not formed in the grooves.

3. The integrated circuit package of claim 1 wherein the pattern of mesas is formed by depositing a conducting material onto the second surface of the die attach pad thereby forming the pattern of mesas having a pattern of grooves located therebetween and
   wherein a pattern of reflow layers formed of reflow material are formed on the surface of the mesas and on surfaces of the lead pads so that the reflow layers are not formed in the grooves.

4. An integrated circuit package having an integrated circuit die attached to the top surface of a die attach pad and electrically interconnected with a plurality of associated lead pads, the combination encapsulated by a cap such that a bottom surface of the die attach pad and a bottom surface of the lead pads are exposed,
   the exposed bottom surface of the die attach pad includes a plurality of mesas defined by a pattern of grooves on the bottom surface of the die attach pad with each of the mesas having a surface area of approximately the same size as a surface area of a lead pad; and
   a contact layer of reflowable material formed on the bottom surface of the plurality of mesas and on the bottom surfaces of the plurality of lead pads such that the contact layer of reflowable material is not formed in the grooves.

5. The integrated circuit package of claim 4 wherein the plurality of mesas comprises a pattern of diamond shaped mesas arranged on the bottom surface of the die attach pad.

6. The integrated circuit package of claim 4 wherein the plurality of mesas comprises a pattern of rectangularly shaped mesas arranged on the bottom surface of the die attach pad.

7. An integrated circuit package comprising:
   a die attach pad and a plurality of associated lead pads;
   an integrated circuit attached to a top surface of the die attach pad;
   electrical connections between the integrated circuit and the plurality of associated lead pads;
   a cap encapsulating the integrated circuit, the die attach pad, the plurality of lead pads, and the electrical connections such that a bottom surface of the die attach pad and bottom surfaces of the plurality of associated lead pads are exposed;
   the exposed bottom surface of the die attach pad includes a pattern of grooves and mesas formed thereon with each of the mesas having a surface area of approximately the same size as lead pad surface area; and
   a contact layer of reflowable material formed on the mesas of the bottom surface of the die attach pad and on the bottom surfaces of the plurality of lead pads wherein the contact layer is not formed in the grooves.

8. The integrated circuit package of claim 7 wherein the grooves on the bottom surface of the die attach pad are filled with a mold material.

9. The integrated circuit package of claim 7 wherein the contact layer of reflowable material is formed of a solder material.

10. An integrated circuit package comprising:
    a die attach pad and a plurality of associated lead pads, wherein the die attach pad includes a first surface and a second surface;
    a semiconductor integrated circuit die attached to the first surface of the die attach pad;
    the second surface of the die attach pad having formed thereon a plurality of mesas defined by a pattern of grooves; and
    a reflow layer comprising a patterned layout of reflow material arranged on surfaces of the mesas and surfaces of the lead pads wherein the reflow material is not on the grooves.

11. An integrated circuit package as in claim 10 wherein the grooves of the die attach pad are filled with encapsulant material.

12. An integrated circuit package as in claim 10 wherein the surface areas of the mesas are approximately the same size as the surface areas of the lead pads.

13. An integrated circuit package as in claim 10 wherein the surface areas of the mesas are in the range of about 0.0625 square millimeters ($mm^2$) to about 0.25 $mm^2$.

14. An integrated circuit package as in claim 10 wherein the surface areas of the mesas are sized to minimize pooling caused by the reflow of a solder paste reflow material used to form the reflow layer.

15. An integrated circuit die attach pad suitable for use with an integrated circuit die package comprising:
    the die attach pad having a first surface and a second surface;
    the first surface suitable for the attachment of an integrated circuit die; and
    the second surface having formed thereon a plurality of mesas defined by a pattern of grooves, wherein the mesas have bottom surface areas that are configured to receive a layer of reflow material, and wherein the wherein the surface area of the bottom surface of each of the mesas is in the range of about 0.0625 square millimeters ($mm^2$) to about 0.25 $mm^2$.

* * * * *

UNITED STATES PATENT AND TRADEMARK OFFICE
CERTIFICATE OF CORRECTION

PATENT NO.     : 6,777,788 B1
DATED          : August 17, 2004
INVENTOR(S)    : Wan et al.

It is certified that error appears in the above-identified patent and that said Letters Patent is hereby corrected as shown below:

Column 10,
Line 62, delete the second instance of "wherein the".

Signed and Sealed this

Seventh Day of December, 2004

JON W. DUDAS
*Director of the United States Patent and Trademark Office*